(12) United States Patent
Gassmann et al.

(10) Patent No.: US 9,230,763 B2
(45) Date of Patent: Jan. 5, 2016

(54) RELAY ASSEMBLY WITH FASTENING CLIP

(71) Applicant: Johnson Electric S.A., Murten (CH)

(72) Inventors: Joerg Gassmann, Dresden (DE); Soeren Heinrich, Dresden (DE)

(73) Assignee: Johnson Electric S.A., Murten (CH)

( * ) Notice: Subject to any disclaimer, the term of this patent is extended or adjusted under 35 U.S.C. 154(b) by 0 days.

(21) Appl. No.: 14/186,401

(22) Filed: Feb. 21, 2014

(65) Prior Publication Data

US 2014/0232495 A1    Aug. 21, 2014

(30) Foreign Application Priority Data

Feb. 21, 2013    (DE) .................. 10 2013 101 736

(51) Int. Cl.
| | |
|---|---|
| *H01H 45/04* | (2006.01) |
| *H01H 50/04* | (2006.01) |
| *H01H 50/14* | (2006.01) |
| *H05K 3/30* | (2006.01) |
| *H01H 1/58* | (2006.01) |
| *H01H 9/26* | (2006.01) |

(52) U.S. Cl.
CPC ............. *H01H 45/04* (2013.01); *H01H 50/047* (2013.01); *H01H 50/14* (2013.01); *H05K 3/301* (2013.01); *H01H 1/5805* (2013.01); *H01H 9/26* (2013.01); *H05K 2201/10393* (2013.01); *H05K 2201/10568* (2013.01); *H05K 2201/2036* (2013.01)

(58) Field of Classification Search
CPC .... H01H 50/047; H01H 50/048; H01H 45/04
USPC ........................................................ 361/819
See application file for complete search history.

(56) References Cited

U.S. PATENT DOCUMENTS

| | | | |
|---|---|---|---|
| 4,729,744 A | 3/1988 | Bet et al. | |
| 5,182,700 A * | 1/1993 | Weimer | .................. 361/781 |
| 6,485,329 B2 | 11/2002 | Eppe et al. | |
| 7,482,546 B2 | 1/2009 | Sellner et al. | |
| 2006/0244555 A1 | 11/2006 | Janot et al. | |
| 2007/0238356 A1 | 10/2007 | Sellner et al. | |
| 2007/0267280 A1 | 11/2007 | Orban et al. | |

FOREIGN PATENT DOCUMENTS

| | | |
|---|---|---|
| DE | 2131478 | 1/1973 |
| DE | 7814794 | 3/1979 |
| DE | 7900929 | 6/1980 |
| DE | 36 41 427 A1 | 6/1988 |
| DE | 3722924 | 1/1989 |
| DE | 8808153 | 10/1989 |
| DE | 8913276 | 1/1990 |
| DE | 29521179 | 10/1996 |
| DE | 19961242 | 6/2001 |
| DE | 202004013708 | 12/2004 |
| DE | 102004042426 | 3/2006 |

(Continued)

*Primary Examiner* — Ramon M Barrera
(74) *Attorney, Agent, or Firm* — Muncy, Geissler, Olds & Lowe, P.C.

(57) ABSTRACT

A relay assembly comprises a relay mounted on a board. The relay may be a single or individual relay or a polyphasic relay. The relay has a housing and at least one dip solder pin extending from the housing and soldered to a circuit board. The relay is mounted on the circuit board via at least one fastening clip having a fitting part fitted into a hole in the housing, a latching part latched to a bore in the board, and a central flange between the fitting part and the latching part.

20 Claims, 4 Drawing Sheets

(56) References Cited

FOREIGN PATENT DOCUMENTS

| | | |
|---|---|---|
| DE | 102006019577 | 10/2007 |
| DE | 102009033541 | 1/2011 |
| EP | 0223622 | 5/1987 |
| EP | 0763843 | 3/1997 |
| EP | 1 646 272 A2 | 4/2006 |
| FR | 2633446 | 12/1989 |
| GB | 2 317 272 A | 3/1998 |

* cited by examiner

Fig. 3
Fig. 4
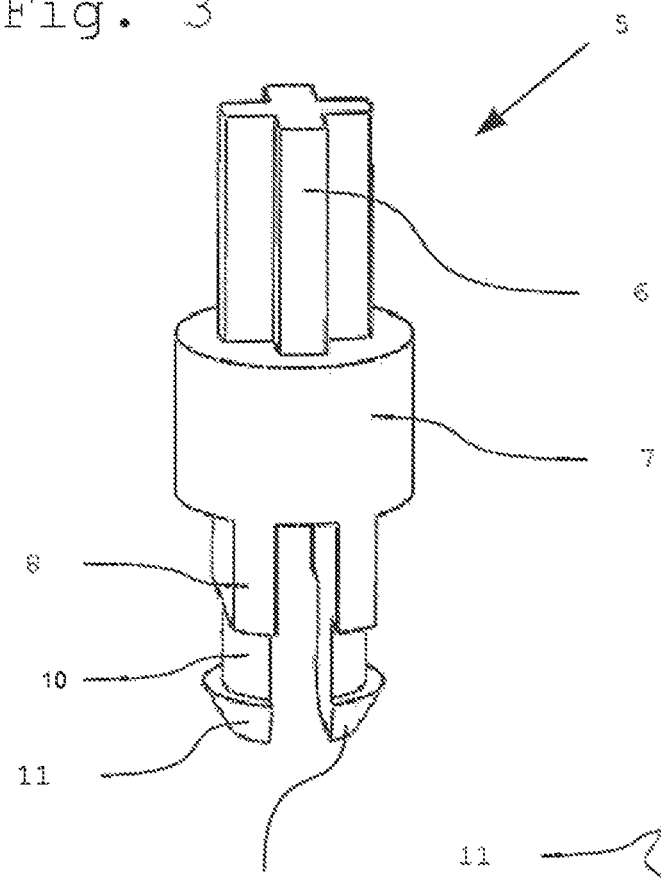
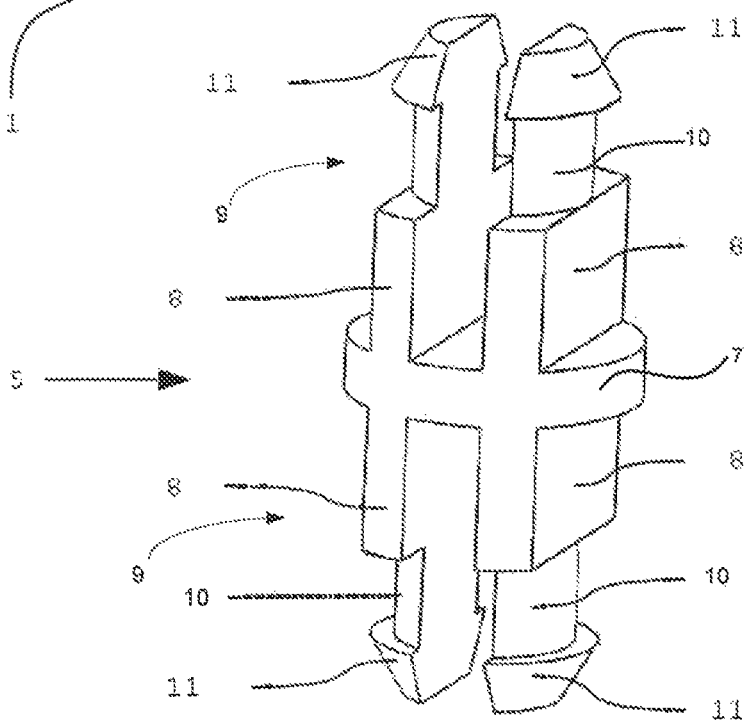

RELAY ASSEMBLY WITH FASTENING CLIP

CROSS REFERENCE TO RELATED APPLICATIONS

This non-provisional patent application claims priority under 35 U.S.C. §119(a) from Patent Application No. 10 2013 101 736.3 filed in Germany on Feb. 21, 2013.

FIELD OF THE INVENTION

The invention relates to an arrangement for the fastening and positioning of relays, in particular both individual relays and polyphasic relays, together as well as directly on electrical boards or circuit boards which, for example, are used in electricity meters for switching currents in domestic, commercial and industrial appliances.

BACKGROUND OF THE INVENTION

A variety of technical solutions for the distancing and fastening of relays with generally rectangular housings are already known. A relay usually has a series of connections, known as dip solder pins, pointing in one direction, by means of which the components are soldered and interconnected to a circuit board. There are also solutions where the relay is plugged in simply by means of suitable and appropriately dimensioned plug connectors. It is also known that the dip solder pins are designed cranked so that contact surfaces or contact points rest on the circuit board to allow a first positioning of the relay on a circuit board before the actual fixing by means of a dip soldering process. However, the cranked dip solder pins are generally not sufficiently stable to absorb and dissipate the forces occurring during the subsequent screwing of additional conductor connections in the circuit boards or connector boards without deformation of the pins or damage to the solder joints.

A technical solution by means of the above support elements is described in DE 295 21 179 U1, in which additional retaining arms oriented in the direction of the circuit board or suitable retaining pins protruding downwards are arranged and mounted directly on the relay housing. The retaining pins are provided with latching or clamping elements to position the relay on the circuit board before the actual soldering and also serve as a support when plugging in or fastening the electrical pathways.

Various retaining lugs and interlocking retaining clips are described in EP 0 223 622 A1, which should allow a direct stringing together or snapping together, i.e., without a distancing of the relays from each other.

Another technical solution for the fastening and positioning of a relay with rectangular housing is shown in DE 88 08 153 U1, in which a sufficient force-fitting fixing of a relay to a circuit board can be ensured before and during the contact of the relay with the circuit board, where a gap corresponding to the dimension of a fixing pin in the direction of the circuit board is arranged centrally in the circuit board.

A similar configuration of a relay with a rectangular housing is furthermore described in DE AS 2 131 478 A2. A largely dimensioned guide rod is arranged in the center of a relay in the direction of the circuit board. Further additional rods are arranged so that they work as a kind of bayonet lock and force-fittingly fasten and position the relay to a base plate.

Another technical solution to solve the problem of fastening and positioning is described in DE 89 13 276 U1. In this case, retaining brackets are configured on the rectangular housing of a relay in the direction of a base plate, on which latching teeth are arranged which engage on the back of the base plate and effect the fastening.

A technical solution is disclosed in DE 79 00 929.3 U1 in which the housings of switchgear are connected using snap-on fastening or other clamping means with an accessory device. The connection is hereby made by rivet-like latching elements that penetrate bores provided with shallow depressions and latch onto the shallow depressions with expanding heads. Here a direct interlocking of individual mutually adjacent switchgear also takes place.

Another technical solution for the connection of mutually adjacent power circuit breakers is shown in DE 199 61 242 A1. Here a connecting element with a cylindrically-shaped body is also described, wherein on both sides of the body are formed two expanding legs, springing back radially and projecting axially in opposite directions, whose outer diameter is smaller than the outer diameter of the body, and whose exposed ends on opposite jacketing lines exhibit radially projecting lugs which latch on in a suspended state behind so-called back springs into the interior of the housings to be connected and therefore ensure the connection. The disadvantage here is that in both of the housings to be connected special back springs must be designed and arranged, which results in a more expensive housing configuration. This means that the production of the housing as a whole can become more expensive.

The following generally applies to all texts encountered, that they are in each case only suitable for switchgear housings to be arranged directly adjacent or overlapping. A distancing and positioning both of housings and homogeneously designed connecting elements to electrical boards or circuit boards are hereby not possible.

SUMMARY OF THE INVENTION

The object of the invention is to create a novel arrangement for the fastening and positioning of relays, in particular both of individual relays and polyphasic relays among each other as well as directly on electrical boards or circuit boards, which can be used universally for different types of relay, already entails a high degree of automation in manufacturing, reliably positions, stabilizes and fastens the relays prior to soldering, provides defined distances, enables a better load and power distribution, simplifies the pre-assembly and is also suitable for an automated pre-assembly process.

Accordingly, the present invention provides a relay assembly comprising a relay having a housing and at least one dip solder pin extending from the housing and soldered to a board. The relay is mounted on the board via at least one fastening clip having a fitting part fitted into a hole in the housing of the relay, a latching part latched to a bore in the board, and a support flange between the fitting part and the latching part.

In the case of the novel arrangement for the fastening and positioning of relays with roughly rectangular relay housings, in particular both individual relays and polyphasic relays with each other as well as directly on electric boards or circuit boards, which are used, for example, for integration in electricity meters as for switching currents in household and industrial appliances, it comprises one, two or a plurality of novel fastening clips arranged between them. These novel fastening clips are arranged in the case of polyphasic relays respectively between adjacent relay housings and/or between relay housings and the electrical board or circuit board. For this purpose corresponding fastening or plug-in holes are arranged in the relay housing and/or in the electrical board or the circuit board, so that the fastening clips can engage with the respective component parts, position them in relation to each other and fasten them to each other. The advantage of this solution lies in the fact that these fastening clips can be used easily for different types or size of relays, which connects both adjacent relay housings to each other or allows the connection and positioning of the relays to electrical boards or circuit boards. Because of this, a higher degree of automation can be achieved in manufacturing, since the fastening clips are easy to manage and to fasten using automation means. The relays can now be reliably positioned, stabilized and fastened prior to soldering, wherein at the same time defined distances can be provided. This allows for a better load and power distribution, or load or power transmission, which simplifies the pre-assembly or also the pre-assembly can be automated. In addition, due to the selectable distancing between relays and the electrical board or circuit board, the exposed surfaces below the relays can be used for other electrical and/or electronic components. For this reason the related board, as a whole, can be designed smaller in its dimensions.

The arrangement for the fastening and positioning of relays results from the use of a novel fastening clip, which comprises a central support flange of a larger diameter than a press-fit pin arranged thereon. The press-fit pin arranged on the support flange has a smaller diameter or is dimensioned so that a contact surface is formed on the support flange which can support the relay housings to be fastened. A spacer leg is arranged on the support flange opposite the arranged press-fit pin. This spacer leg can be designed optionally non-slitted, partially slitted or completely slitted. A crosswise slit is also generally possible, so that four latching part heads are then formed. If the spacer leg is simply completely slitted, two spacer legs formed separately from each other result. The latching part connects to the spacer leg. It comprises a latching recess and the latching head.

In the case of the non-slitted configuration the latching part is made of elastic material, so that a pressing-in compresses the latching head during its assembly, before it latches in a correspondingly shaped fastening hole, i.e., in an undercut of the relay housing or in the board or the circuit board. Preferably the spacer leg and the latching part can be centrically arranged completely slitted, wherein during the assembly the latching part as a whole is compressed during the assembly and once again rebounds when the end position is reached.

Then the protruding latching head engages with its projecting surfaces in a correspondingly dimensioned undercut arranged in the relay housing or undercut designed by the relay housing itself or in the electrical board or the circuit board and a sufficiently strong connection can therefore be made.

Preferably the press-fit pin is designed in the form of a cross in cross-section. Its length can therefore vary. It is crucial that the required security against accidental slipping out from the plug-in hole is ensured. A press fit is therefore designed between the press-fit pin of the fastening clip and a portion of the hole in the relay housing forming a press-fit shaft.

For a simpler assembly a chamfer can furthermore be arranged on the press-fit pin, so that the press-fit pin is inserted better and more quickly in the correspondingly formed press-fit shaft of the plug-in hole in the housing of a relay. In addition, the press fit must not be configured over the whole length of the press-fit pin.

In order to increase security against accidental slipping out, it makes sense if, in addition, sawtooth-like barbed surfaces or tooth-like elevations are arranged partially or completely on the surface of the press-fit pin. Further tooth-like elevations can also be located in the press-fit shaft so that an almost non-detachable connection results between the fastening clip and the relay.

In principle it is also conceivable, if the mutual distance between the relay housings or the distance to the board or the circuit board must be changed temporarily, to arrange additional distancing elements or distancing rings on the press-fit pin of the fastening clip. The holes in these distancing elements or distancing rings are therefore configured so that they can be pushed over the press-fit pin until they rest on the contact surface of the support flange. The advantage of this is that one type of fastening clip can be used for various desired distances, in which one or several distancing elements or distancing rings are arranged in between on the press-fit pin.

It could also be advantageous for various applications if in the case of the arrangement for the fastening and positioning of relays the fastening clip is designed with a plurality of parts.

In another novel design the fastening clip can be designed graduated with two or more different sizes of press-fit pins and/or latching parts. The spacer legs can also have one or a plurality of graduations, whereby various distancing heights can be realized with one fastening clip.

In a special embodiment the support flange can be optionally square, rectangular or oval in design. This has the advantage that the contact surface, for example, on the electrical board or circuit board or between the respective adjacent relay housings can be designed larger, whereby loads which are applied to the relay housing(s) are distributed over a larger area and the concentrated loads can be reduced on the two contact surfaces of the support flange.

In certain cases it may be furthermore advantageous if in the case of the arrangement for the fastening and positioning of relays the press-fit pin and/or the spacer leg and/or the latching part are arranged on the support flange off-center laterally displaced relative to the midline of the support flange. Through this eccentric design of the fastening clip both asymmetries between the plug-in holes in the relay housing and the fastening holes in the electrical board or circuit board can be compensated. It is thereby also possible for production reasons, where necessary, to arrange the fastening holes at other locations not directly opposite the plug-in holes of the relay housings, whereby, for example, the board size, the board layout and the placement of the board, where necessary, can be more easily optimized.

Preferably, the support flange of the at least one fastening clip has a surface formed on an end thereof adjacent the fitting part and in contact with the at least one housing of the relay when the fitting part is fitted into the hole in the at least one housing.

Preferably, the fitting part of the at least one fastening clip includes a press-fit finger having a cross shaped cross section which engages a complementarily shaped portion of the hole in the housing.

Preferably, the fitting part of the at least one fastening clip includes a first fitting stage connected to the support flange and a second fitting stage connected to the first fitting stage.

Preferably, the at least one fastening clip further includes a distancing ring surrounding a portion of the fitting part adjacent the support flange to adjust a distance between the housing and the board.

Preferably, the fitting part of the at least one fastening clip includes a spacer leg coupled to the central flange, a latching recess connected to the spacer leg, and a latching head connected to the latching recess.

Preferably, the latching part of the at least one fastening clip includes a spacer leg connected to the support flange.

Preferably, the latching part of the at least one fastening clip includes a latching recess coupled to the spacer leg and a latching head connected to the latching recess.

Preferably, the latching part of the at least one fastening clip is elastic and compressed into the bore of the board.

Preferably, the latching part of the at least one fastening clip further includes an intermediate recess and an intermediate latching head between the spacer leg and the latching recess.

Preferably, the spacer leg of the at least one fastening clip is non-slitted, partially slitted, or completely slitted.

Preferably, the at least one fastening clip includes a plurality of fastening clips; the relay is a polyphasic relay having a plurality of housings stack mounted to each other; at least one first fastening clip of the plurality of fastening clips having the fitting part fitted in a hole in the housings and the latching part latched in a bore in the board; and at least one second fastening clip of the plurality of fastening clips having the fitting part fitted in a hole in a first housing of the plurality of housings and the latching part latched to a hole in a second housing of the plurality of housings.

Optionally, the hole in the housing supporting a first fastening clip and the hole in the housing supporting a second fastening clip may be the same hole with the first and second fastening clips inserted in respective ends thereof.

Preferably, the at least one second fastening clip further includes a distancing ring surrounding a portion of the fitting part adjacent the support flange to adjust a distance between the first housing and the second housing of the plurality of housings.

Preferably, at least one of the fitting part and the latching part has two or more variably-sized press-fit pins or latching heads.

According to another aspect, the present invention provides a relay assembly, comprising a first relay and a second relay, each relay having a housing, wherein the relays are mounted to each other via at least one fastening clip having a fitting part fitted into a hole in the housing of the first relay, a latching part latched to a hole in the housing of the second relay, and a support flange between the fitting part and the latching part maintaining a predetermined spacing between the housings.

BRIEF DESCRIPTION OF THE DRAWINGS

Various embodiments of the present invention will now be described, by way of example only, with reference to figures of the accompanying drawings. In the figures, identical or related structures, elements or parts that appear in more than one figure are generally labeled with same reference numerals in all the figures in which they appear. Dimensions of components and features shown in the figures are generally chosen for convenience and clarity of presentation and are not necessarily shown to scale. The figures are listed below.

FIGS. 3, 4, 5, and 6 illustrate fastening clip in accordance with various specific embodiments of the present invention.

DETAILED DESCRIPTION OF VARIOUS EMBODIMENTS

Embodiments of the invention shall be explained in more detail below with the aid of FIGS. 1 to 6.

Figure 1:
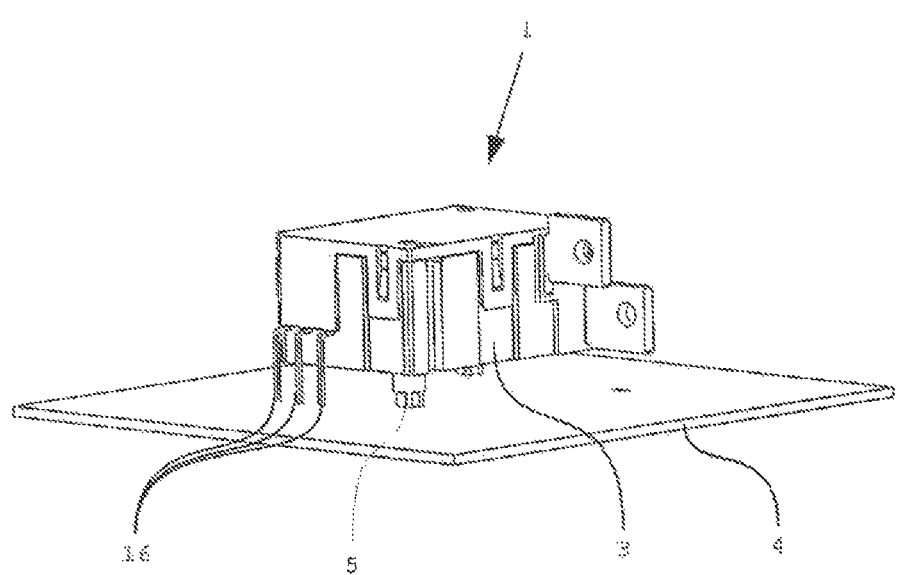
FIG. 1 illustrates an arrangement of a single relay on a board or circuit board in accordance with an embodiment of the present invention.

FIG. 1 illustrates a single relay 1 having a housing 3 and at least one dip solder pin 16. Relay 1 is fastened to an electrical board or circuit board 4 (hereinafter referred to as board) via two fastening clips 5 in accordance with an embodiment of the present invention. It is clear from FIG. 1 how the positioning of relay 1 on board 4 takes place with two fastening clips 5, wherein a defined distance between board 4 and relay housing 3 of single relay 1 is produced. As a result, it is easily possible to equip board 4 in this free space with other components, under the relay where necessary. Before the soldering of dip solder pins 16, relay 1 is reliably positioned and secured to board 4 against slipping or tilting in production. In addition, relay 1 is securely supported and potential forces acting during the connection of the relay are intercepted by fastening clips 5 and diverted to board 4. The inner structure of relay 1 is secured against loads. Furthermore, the wave soldering of all components and all dip solder pins 16 onto board 4 in a single operation is possible.

Figure 2:
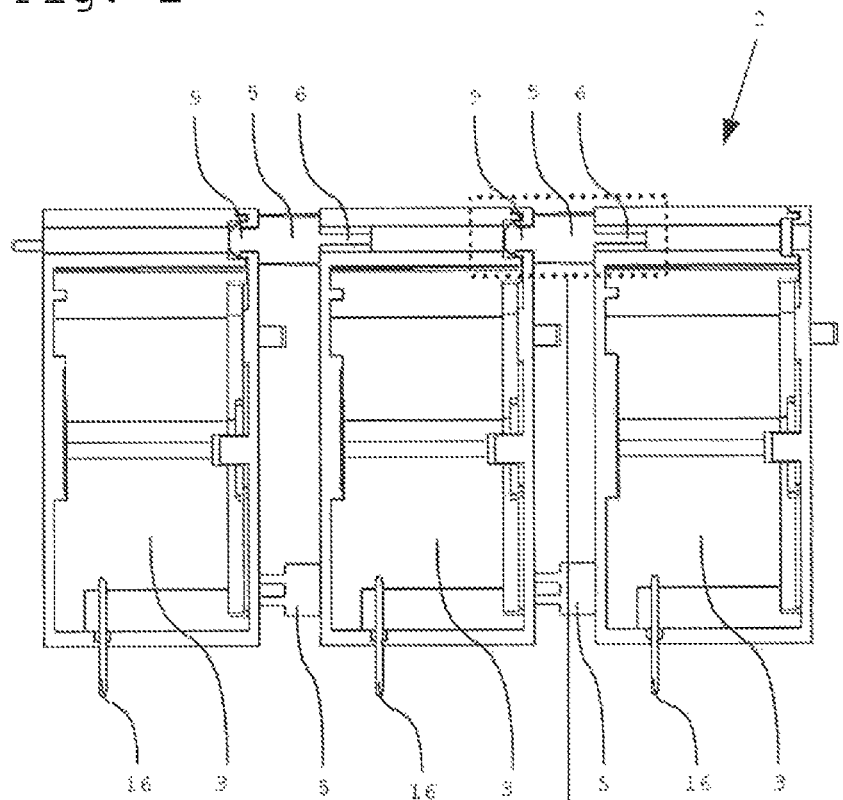
FIG. 2 illustrates an arrangement of a polyphasic relay with three relay housings in accordance with another embodiment of the present invention.
Figure 2A:
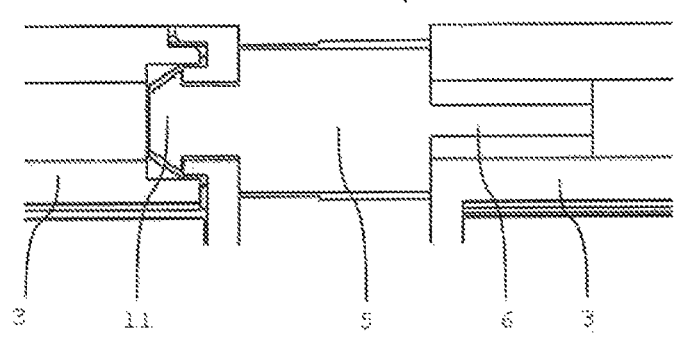
FIG. 2A illustrates, on an enlarged scale a portion of FIG. 2.

FIG. 2 illustrates a polyphasic relay 2 with three relay housings 3 fitted to each other via fastening clips 5 according to an embodiment of the present invention. By way of example, polyphasic relay 2 includes three single relays stacked together with distance there between defined by fastening clips 5. This assembled block is in turn able to be positioned and fastened with a corresponding number of fastening clips 5 on a board, e.g., circuit board 4 as shown in FIG. 1. The detail view illustrated in FIG. 2A shows a fastening clip 5 in the engagement between two adjacent relay housings 3.

FIG. 3 illustrates a fastening clip 5 in accordance with a specific embodiment of the present invention. Fastening clip 5 includes a press-fit pin 6 designed in the form of a cross, and a central support flange 7 connected to press-fit pin 6. Press-fit pin 6 arranged on the support flange 7 has a smaller diameter or is dimensioned so that a contact surface is formed on the support flange 7 which can support a relay housing 3 to be fastened. A spacer leg 8 is arranged on the support flange opposite press-fit pin 6. Spacer leg 8 can be designed as non-slitted, partially slitted, or completely slitted. If spacer leg 8 is completely slitted, as shown in FIG. 3, two spacer legs 8 are formed extending from support flange 7. A latching part 9 connects to each spacer leg 8 and includes a latching recess 10 and a latching head 11 at an end of fastening clip 5 remote from press-fig pin 6. Latching part 9 is preferably made of an elastic material and designed to be compressed during the assembly so that latching head 11 during its assembly is compressed into a corresponding hole or board bore before latching a correspondingly shaped undercut of relay housing 3 or in board 4. For the board, the undercut may be simply the other side of the board.

When relay 1 is assembled to board 4 via two fastening clips 5 as shown in FIG. 1, latching recess 10 of each fastening clip 5 clamps down on a board bore in circuit board 4. On the underside of the board, latching head 11 protrudes so that the projecting surfaces of two latching part heads 11 overlap the edge of the board bore and effect the fastening. In accordance with a preferred embodiment, the diameter of latching recess 10 corresponds with the diameter of the board bore in board 4, thereby resulting in a tight fastening of fastening clip 5 to board 4.

FIG. 4 illustrates a dual slit fastening clip 5 in accordance with an embodiment of the present invention. Dual slit fastening clip 5 does not have press-fit pin 6 shown in FIG. 3, but includes two spacer legs 8, one on each side of support flange 7 and with latching parts 9 with latching recess 10 and a latching part head 11 extending therefrom. As a result, dual slit fastening clip 5 is able to latch to both sides in the same way if undercut fastening holes are arranged at appropriate locations in relay housings 3 and board 4.

Figure 5:
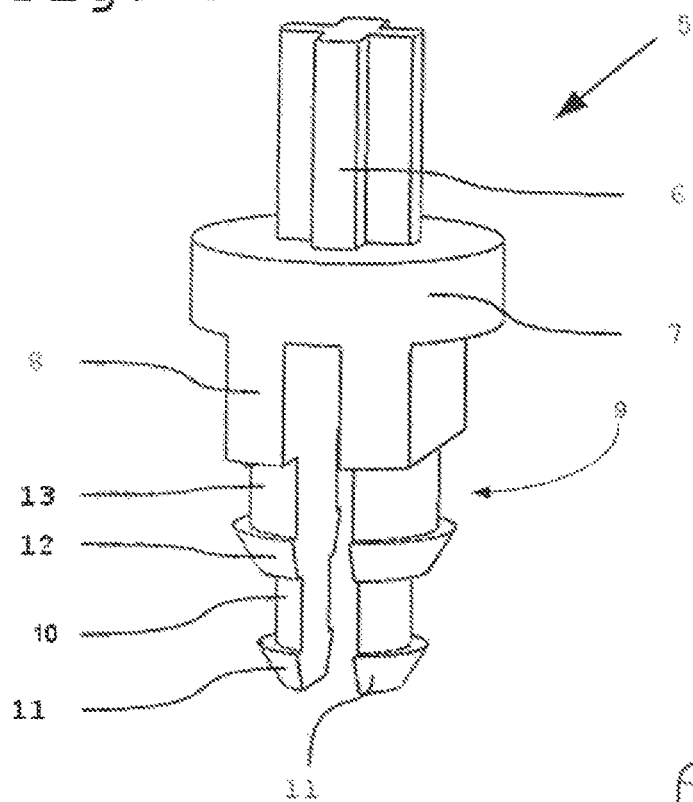

FIG. 5 illustrates a fastening clip 5 in accordance with another specific embodiment of the present invention, in which latching part 9 includes two graduated recesses and heads. Specifically, latching part 9 includes an intermediate recess 13 between spacer leg 8 and an intermediate latching head 12, and a latching recess 10 between intermediate latching head 12 and a distal latching head 11. Like latching parts 9 in fastening clips 5 described supra with reference to FIGS. 3 and 4, latching part 9 here may be partially slit or completely slit. Furthermore, the diameters of intermediate recess 13 and intermediate latching head 12 may be the same as or different from those of latching recess 10 and latching head 11, respectively. Such multiple latching head and recess design of latching part 9 enables fastening clip 5 to be fastened to board 4 or adjacent relay housing 3 at variable distances and/or to board bores of different dimensions.

Figure 6:
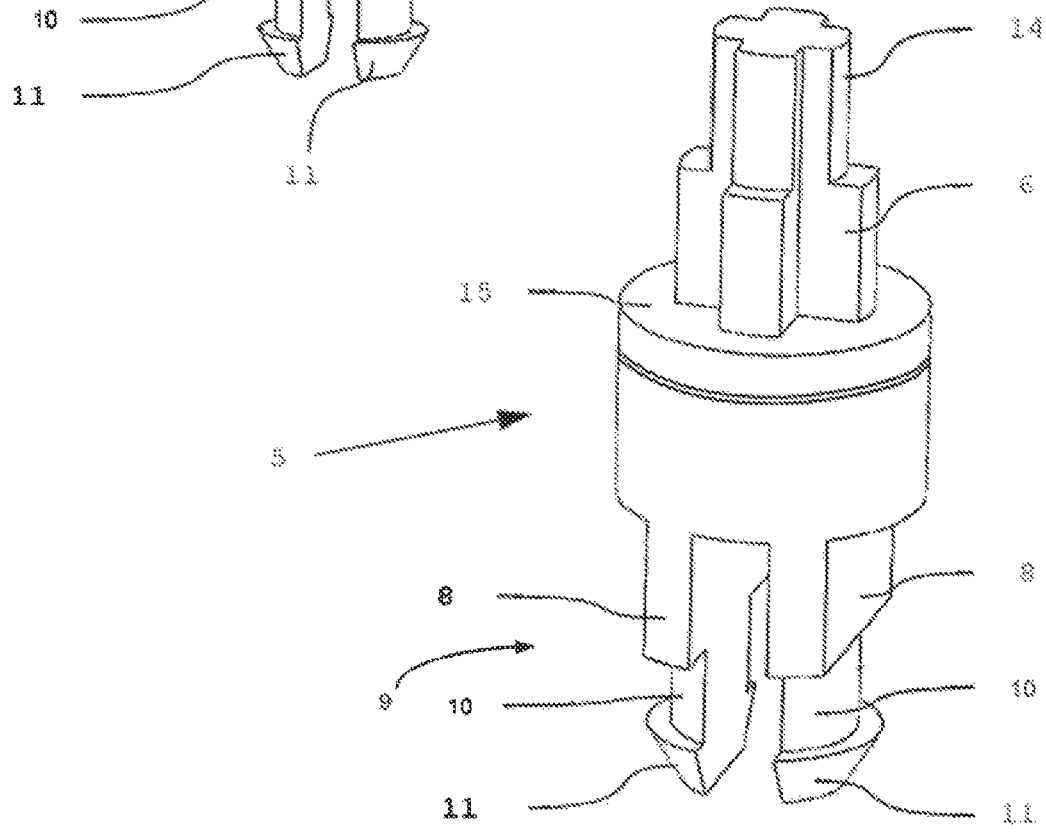

FIG. 6 illustrates a fastening clip 5 in accordance with yet another specific embodiment of the present invention in which press-fit pin 6 is configured to be graduated, including a normal press-fit pin 6 and a graduated press-fit pin tip 14. In accordance with the present invention, press-fit pin 6 of fastening clip 5 may include more than two pin stages of different sizes. For example, press-fit-pin 6 may have sawtooth-like barbed surface to generate multiple pin stages. A single such fastening clip 5 with multiple press-fit pin stages can be used to produce different installation distances. This is beneficial where the space between relay housing 3 and board 4 were to be changed. In such applications, relay housing 3 may have multiple plug-in holes of different dimensions or a plug-in hole with multiple stages different dimensions corresponding to different sizes of the press-fit pin stages in graduated press-fit pin 6. Furthermore, fastening clip 5 may also include a distancing ring 15 on press-fit pin 6 to further facilitate the adjustment of the distance between relay housings 3 in polyphasic relay 2, and/or relay 1 or polyphasic relay 2 and board 4.

This technical solution described above is able to be used for relays for installation in electricity meters, as are used for switching currents in domestic, commercial and industrial appliances.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow. By way example, a fastening clip in accordance with the present invention may combine the multiple latching stage feature described with reference to FIG. 5 and the multiple press-fit pin stage feature described with reference to FIG. 6. Also by way of example, a fastening clip in accordance with the present invention may combine the dual slit feature described with reference to FIG. 4 and the multiple latching stage feature described with reference to FIG. 5.

The invention claimed is:

1. A relay assembly, comprising a relay having at least one housing and at least one dip solder pin extending from the at least one housing and soldered to a board, wherein the relay is mounted to the board via at least one fastening clip having a fitting part fitted into a hole in the at least one housing of the relay, a latching part latched to a bore in the board, and a support flange between the fitting part and the latching part, wherein the latching part is compressed to be inserted through the bore along a direction from the flange to the latching part during assembly.

2. The relay assembly of claim 1, wherein the support flange of the at least one fastening clip has a surface formed on an end thereof adjacent the fitting part and in contact with the at least one housing when the fitting part is fitted into the hole in the at least one housing.

3. The relay assembly of claim 2, wherein the fitting part of the at least one fastening clip includes a press-fit finger having a cross shaped cross section which engages a complementarily shaped portion of the hole in the housing.

4. The relay assembly of claim 1, wherein the fitting part of the at least one fastening clip includes a first fitting stage connected to the support flange and a second fitting stage connected to the first fitting stage.

5. The relay assembly of claim 1, wherein the at least one fastening clip further includes a distancing ring surrounding a portion of the fitting part adjacent the support flange to adjust a distance between the housing and the board.

6. The relay assembly of claim 1, wherein the fitting part of the at least one fastening clip includes a spacer leg coupled to the central flange, a latching recess connected to the spacer leg, and a latching head connected to the latching recess.

7. The relay assembly of claim 1, wherein the latching part of the at least one fastening clip includes a spacer leg connected to the support flange to set a distance between the board and the at least one housing.

8. The relay assembly of claim 7, wherein the latching part of the at least one fastening clip includes a latching recess coupled to the spacer leg and a latching head connected to the latching recess.

9. The relay assembly of claim 7, wherein the latching part of the at least one fastening clip is elastic and compressed into the bore of the board.

10. The relay assembly of claim 7, wherein the latching part of the at least one fastening clip further includes an intermediate recess and an intermediate latching head between the spacer leg and the latching recess.

11. The relay assembly of claim 7, wherein the spacer leg of the at least one fastening clip is non-slitted, partially slitted, or completely slitted.

12. The relay assembly according to claim 1, wherein the at least one fastening clip includes a plurality of fastening clips; the relay is a polyphasic relay having a plurality of housings stack mounted to each other; at least one first fastening clip of the plurality of fastening clips having the fitting part fitted in a hole in the housings and the latching part latched in a bore in the board; and at least one second fastening clip of the plurality of fastening clips having the fitting part fitted in a hole in a first housing of the plurality of housings and the latching part latched to a hole in a second housing of the plurality of housings.

13. The relay assembly of claim 12, wherein the at least one second fastening clip further includes a distancing ring surrounding a portion of the fitting part adjacent the support flange to adjust a distance between the first housing and the second housing of the plurality of housings.

14. The relay assembly of claim 1, wherein at least one of the fitting part and the latching part is laterally displaced with respect to a midline of the support flange.

15. The relay assembly of claim 1, wherein at least one of the fitting part and the latching part has two or more variably-sized graduated press-fit pins or latching heads.

16. The relay assembly of claim 1, wherein the support flange is of an oval design.

17. The relay assembly of claim 4, wherein the diameter of the first fitting stage is larger than the diameter of the second fitting stage.

18. A relay assembly, comprising a relay having at least one housing and at least one dip solder pin extending from the at least one housing and soldered to a board, wherein the relay is mounted to the board via at least one fastening clip having a fitting part fitted into a hole in the at least one housing of the relay, a latching part latched to a bore in the board, and a support flange between the fitting part and the latching part, wherein the flange sets a distance between the board and the at least one housing.

19. A relay assembly, comprising a relay having at least one housing and at least one dip solder pin extending from the at least one housing and soldered to a board, wherein the relay is mounted to the board via at least one fastening clip having a fitting part fitted into a hole in the at least one housing of the relay, a latching part latched to a bore in the board, and a support flange between the fitting part and the latching part, wherein the at least one fastening clip further includes a distancing ring surrounding a portion of the fitting part adjacent the support flange to adjust a distance between the housing and the board.

20. A relay assembly, comprising a relay having at least one housing and at least one dip solder pin extending from the at least one housing and soldered to a board, wherein the relay is mounted to the board via at least one fastening clip having a fitting part fitted into a hole in the at least one housing of the relay, a latching part latched to a bore in the board, and a support flange between the fitting part and the latching part, wherein the at least one fastening clip includes a plurality of fastening clips; the relay is a polyphasic relay having a plurality of housings stack mounted to each other; at least one first fastening clip of the plurality of fastening clips having the fitting part fitted in a hole in the housings and the latching part latched in a bore in the board; and at least one second fastening clip of the plurality of fastening clips having the fitting part fitted in a hole in a first housing of the plurality of housings and the latching part latched to a hole in a second housing of the plurality of housings.

* * * * *